United States Patent
Bock et al.

(10) Patent No.: US 6,778,123 B1
(45) Date of Patent: Aug. 17, 2004

(54) CALIBRATION OF A/D CONVERTERS BY REUSING CAPACITORS USED FOR SAMPLING

(75) Inventors: Nikolai Bock, Pasadena, CA (US); Alexander Krymski, Montrose, CA (US)

(73) Assignee: Micron Technology, Inc., Boise, ID (US)

( * ) Notice: Subject to any disclaimer, the term of this patent is extended or adjusted under 35 U.S.C. 154(b) by 380 days.

(21) Appl. No.: 09/746,565

(22) Filed: Dec. 21, 2000

Related U.S. Application Data (60) Provisional application No. 60/171,913, filed on Dec. 21, 1999.

(51) Int. Cl.[7] ............................................. H03M 1/12
(52) U.S. Cl. ................................. 341/155; 341/118
(58) Field of Search ............................... 341/118, 120, 341/155

(56) References Cited

U.S. PATENT DOCUMENTS

| | | | | |
|---|---|---|---|---|
| 5,635,937 A | * | 6/1997 | Lim et al. ..................... 341/161 |
| 5,654,708 A | * | 8/1997 | Boehl et al. ................. 341/120 |
| 5,847,669 A | * | 12/1998 | Kochi .......................... 341/172 |
| 5,877,715 A | * | 3/1999 | Gowda et al. ............... 341/122 |
| 5,920,274 A | * | 7/1999 | Gowda et al. ............... 341/155 |
| 5,982,318 A | * | 11/1999 | Yiannoulos ................. 341/155 |
| 6,124,819 A | * | 9/2000 | Zhou et al. .................. 341/155 |
| 6,476,751 B1 | * | 11/2002 | Krymski et al. ............. 341/155 |
| 6,538,591 B2 | * | 3/2003 | Sato et al. ................... 341/155 |

* cited by examiner

*Primary Examiner*—Michael Tokar
*Assistant Examiner*—Linh V Nguyen
(74) *Attorney, Agent, or Firm*—Dickstein Shapiro Morin & Oshinsky LLP (57) ABSTRACT

An A/D converter element of the successive approximation type uses its capacitors both for conversion and for calibration. A calibration face is carried out in which calibration values are obtained. These values are stored and then later used for adjustment of the values obtained from the capacitors.

37 Claims, 10 Drawing Sheets

CALIBRATION OF A/D CONVERTERS BY REUSING CAPACITORS USED FOR SAMPLING

CROSS REFERENCE TO RELATED APPLICATIONS

This application claims the benefit of the U.S. Provisional Application No. 60/171,913, filed on Dec. 21, 1999.

BACKGROUND

The present application describes calibration of A/D converters, and specifically calibration of successive approximation A/D converters using the same capacitors that are used for signal conversion.

Many A/D converters depend on comparators to make their conversion. Each A/D converter can have an inherent offset caused by the operation of its comparators. One use of A/D converters is in image sensors. The image sensor produces an analog output which is buffered by a source follower, and then is converted to digital by the A/D converter. The comparator offset often exceeds the required level of sensitivity from the A/D converter. Calibration improves the sensitivity.

The calibration is often carried out by attaching a number of additional capacitors to a signal line, and using those capacitors to calibrate the A/D converter.

This may result in an increasing capacitive load for a column source follower in the image sensor. Moreover, this takes up some percentage of the precious real estate on the chip. This is often a difficult issue in these A/D converters. This kind of system may take up some of the area. The separate circuitry for control of these capacitors may also require additional control signals. This may also itself take up precious area.

SUMMARY

The present application describes using the same capacitors for calibration and to carry out the work that is done by the A/D converter. An additional control unit may be used with an additional latch to memorize an offset level.

BRIEF DESCRIPTION OF THE DRAWINGS

These and other aspects will now be described in detail with reference to the accompanying drawings, wherein.

DETAILED DESCRIPTION

According to the present system, capacitors in an A/D converter, e.g., a successive approximation A/D converter, are controlled using an additional latch and control unit in order to memorize the offset level. In summary, each of the capacitors are controlled. Each capacitor has a bottom plate and a top plate. The bottom plate is controlled to be either at the ground level or some adjusted level. The level on the bottom plate can therefore be used to change the effective voltage on the capacitor, and therefore can be used to adjust for calibration. A bank of capacitors is provided, and a calibration value is obtained. This calibration level may be a digital value, where the relationship between the ones and zeros sets the calibration level which is applied to the capacitor.

This system is preferably used in an image sensor. An image sensor element, such as a MOS device e.g. a photodiode or a photogate, produces an output which is sent to the A/D converter. The converter can be formed in CMCS as shown, and can be on the same substrate as the photodetector. The photodetector may also have an associated, in pixel follower, and a pixel switching transistor, i.e., an active pixel sensor can be made using these techniques.

In a conventional A/D converter, the bottom plate of the sampling capacitor is connected to ground or a reference. The top plate of the capacitor is connected to a signal line. The capacitor is connected to the reference voltage source when an additional voltage increment needs to be added to the signal and hold in order to make a decision by the comparator.

The present embodiment uses a special additional reference voltage source. The reference voltage source can be at a level (Vref2) of double the reference voltage (Vref1).

Figure 1A:
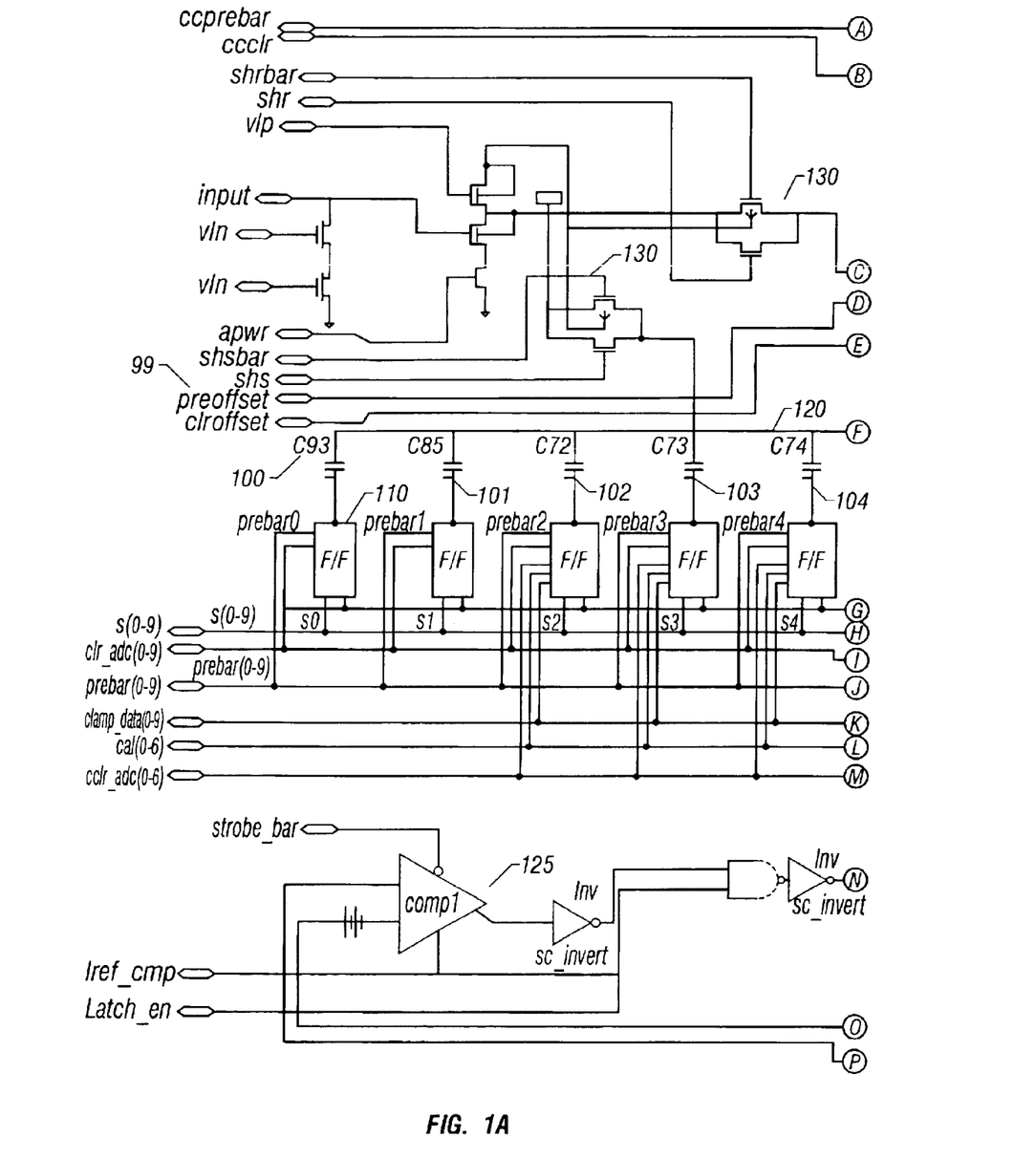
FIG. 1 shows a basic diagram of an A/D converter which reuses capacitors, and includes a number of latches therein.
Figure 1B:
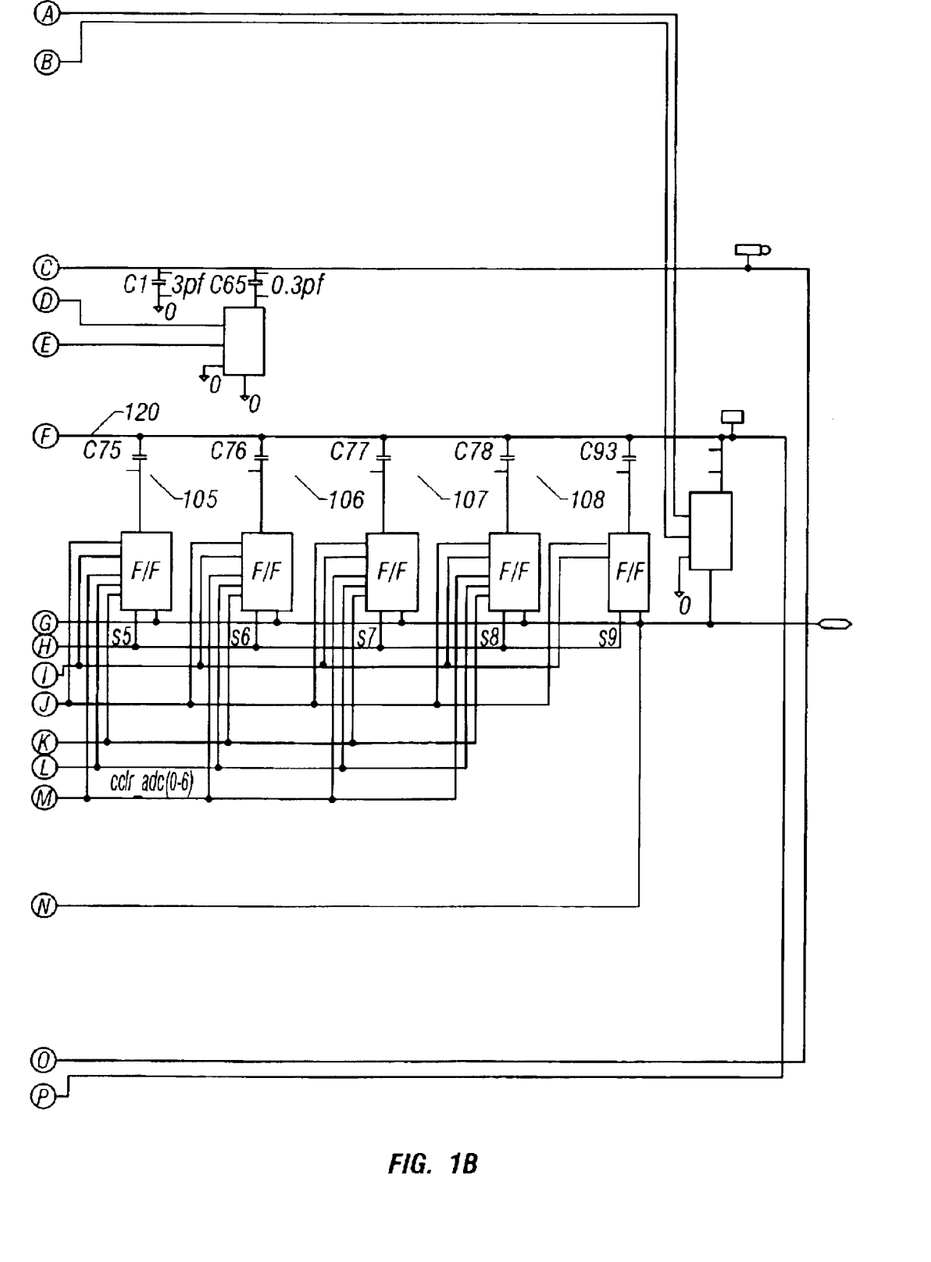

FIG. 1 shows a schematic of the A/D converter circuit 99. The circuit includes a plurality of capacitors, shown as 100 through 108. Each capacitor has its bottom plate connected to an associated latch such as 110. The top plate of each capacitor is connected to the signal line 120. The signal line may receive a signal from any of the number of different image pixels shown generically as 130. Each latch is controlled by a control signal that is produced by a control circuit shown in further detail in FIG. 2. The output of the signal line 120 is also connected to a comparator 125 which carries out A/D conversion along with the associated circuitry.

Figure 2A:
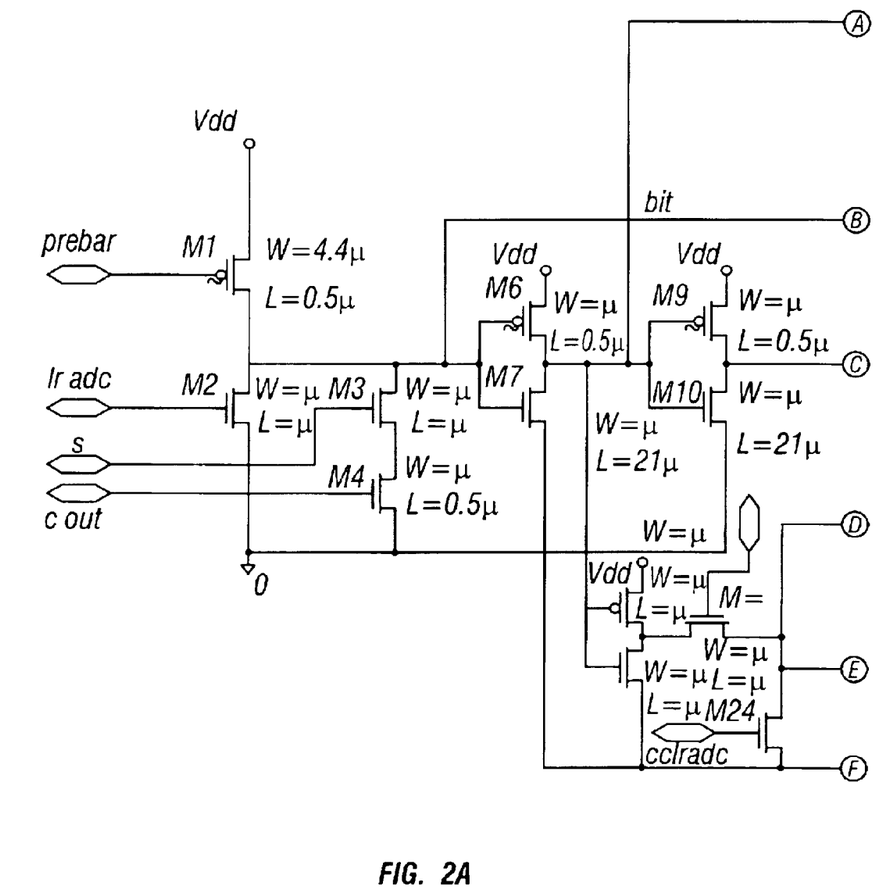
FIG. 2 shows a detailed diagram of the control circuit for such an A/D converter.
Figure 2B:
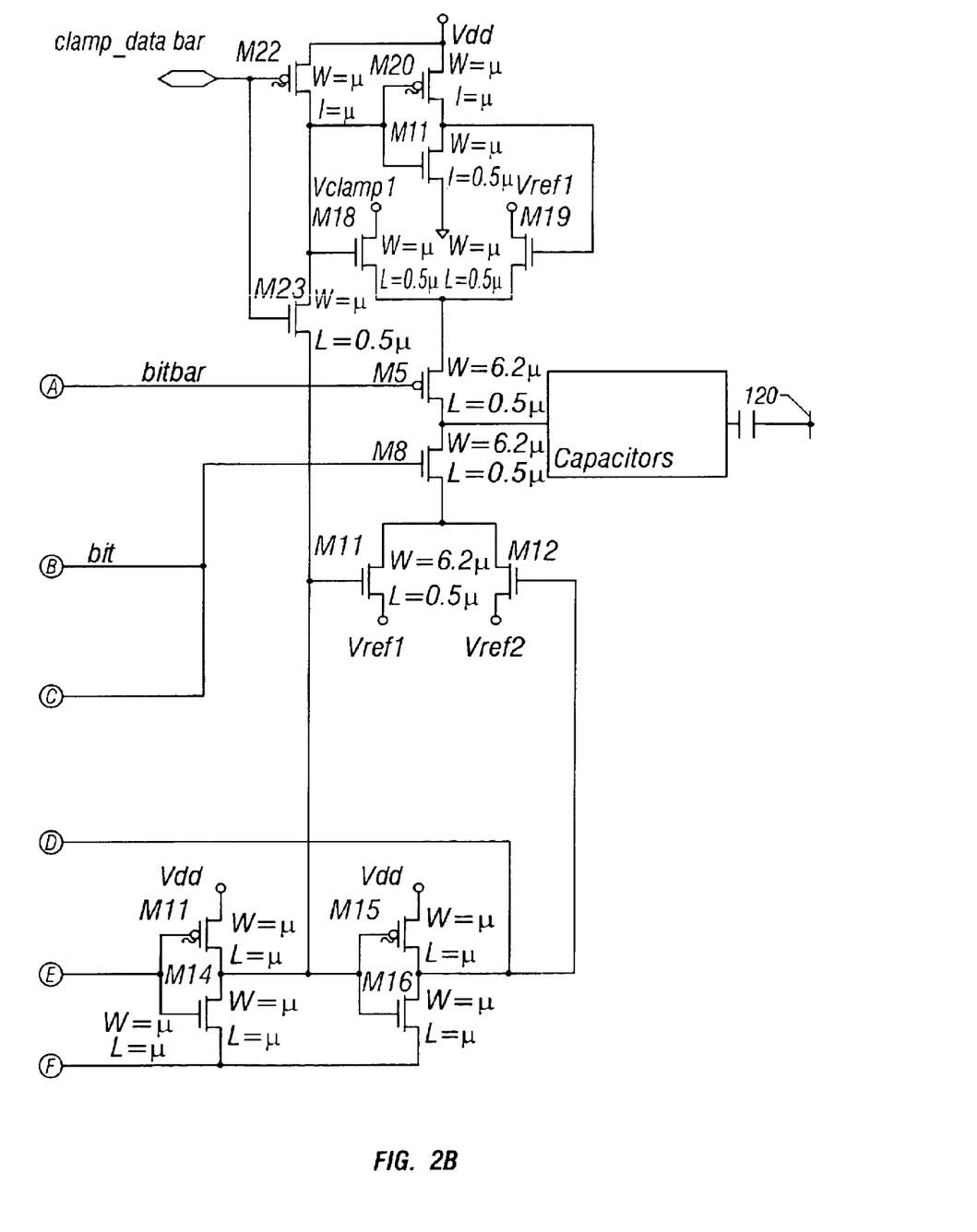
Figure 3:
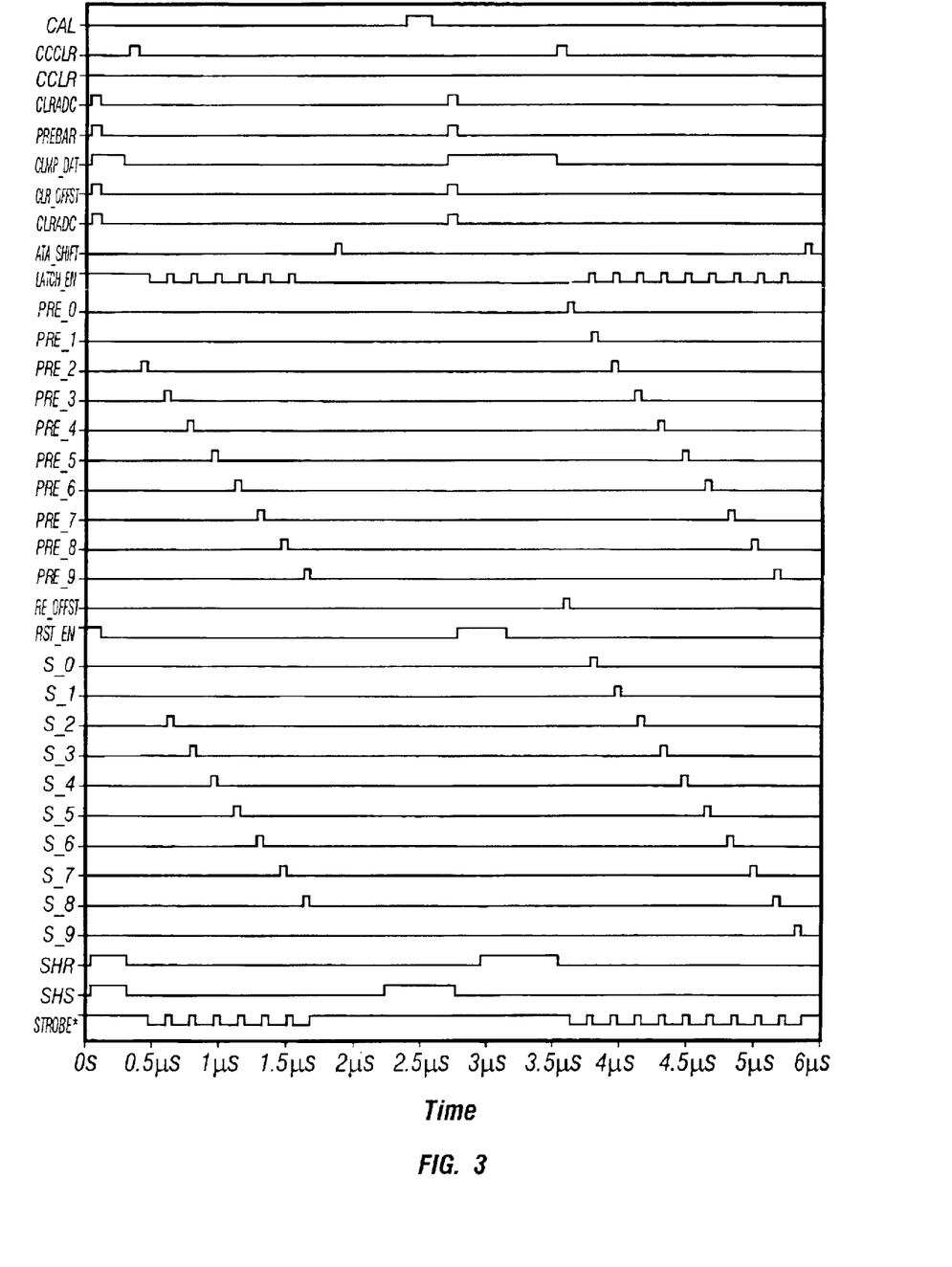
FIG. 3 shows the timing diagram associated with the circuit.

FIG. 2 shows the details of a circuit for the control unit. The control unit shown in FIG. 2 includes additional components for memorizing specified levels that are associated with calibration. An additional latch is provided for memorizing the offset on the transistors M13 through M16. Inverters are associated with the transistors M20 to M21 and M26–M27. Switches are associated with transistors 11, 12, 18, 19, 22, 23, 24 and 28. A timing diagram showing the operation of the different elements which are added is shown in FIG. 3.

The circuit operates as follows. Calibration occurs by applying the same voltage (the clamping voltage vclamp1) to both the signal and the reset lines that is applied to both inputs of the comparator 125. This same voltage is applied to the source of switch M18. During the time while the comparator is being charged, the capacitors are simultaneously charged through the switches M5 and M18 to the reset level. The clamping operation also turns on a number of additional signals. A first turns on the switch M2, and a second turns on switch M24. These two switches reset the values in each of the latches. After charging the capacitors and resetting the latches, offset conversion starts. This procedure is done in a similar way to that done for a conventional A/D converter.

During this time, the switches M11 and M18 are on, and M12 and M19 are off. After the calibration process occurs, switch M21 is closed and the result is written to the calibration latch on transistors M13–M16. From that moment on, the calibration latch(es) holds the result until the next calibration. All further work of the control unit depends on this calibration result.

When the latched value is zero, switches M18 and M11 are turned on, and conversion is carried out in a similar way to that done in other A/D converters, other than resetting the first latch on transistors M6–M10.

Figure 4:
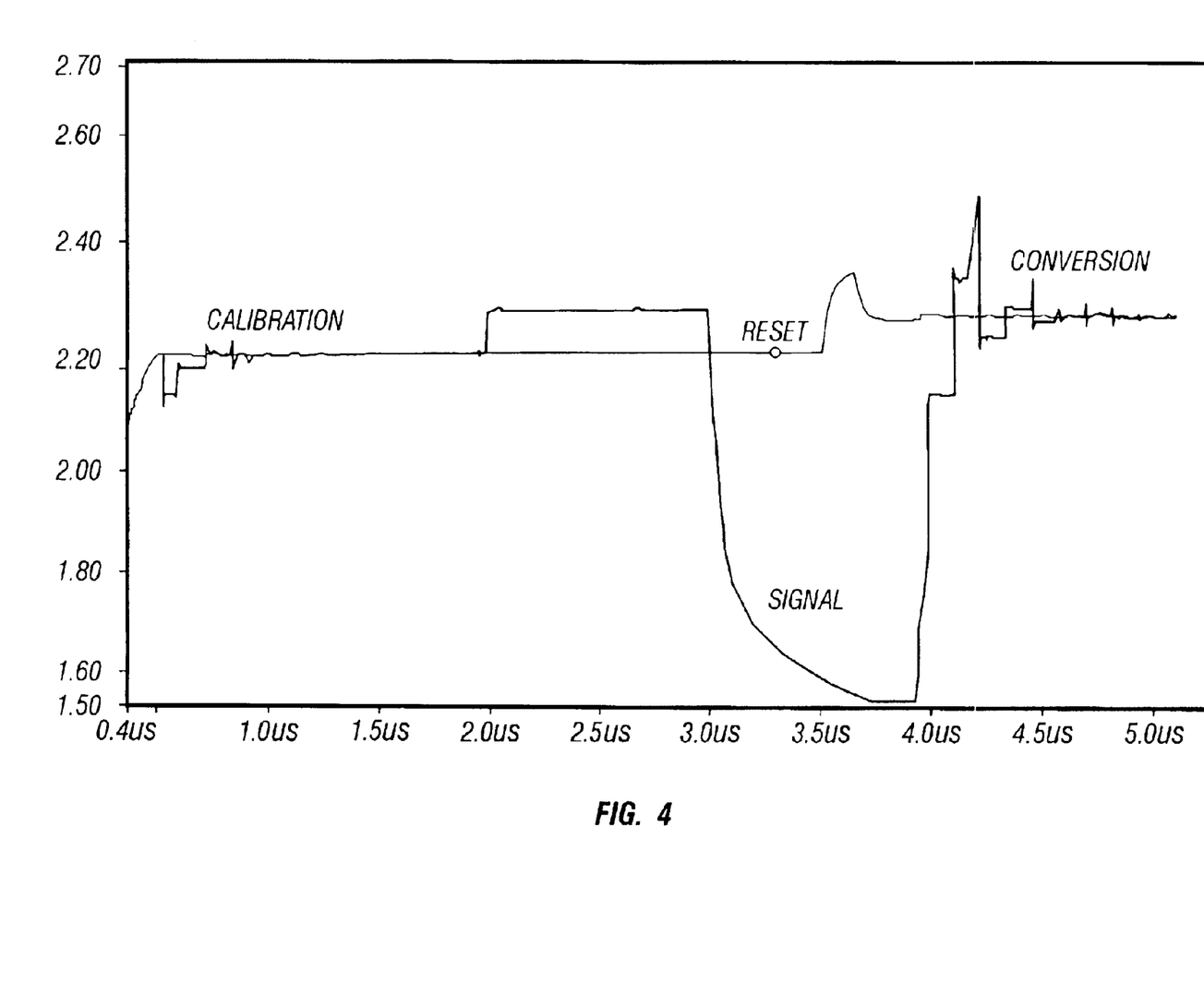
FIG. 4 shows a simulation of results.
Figure 5:
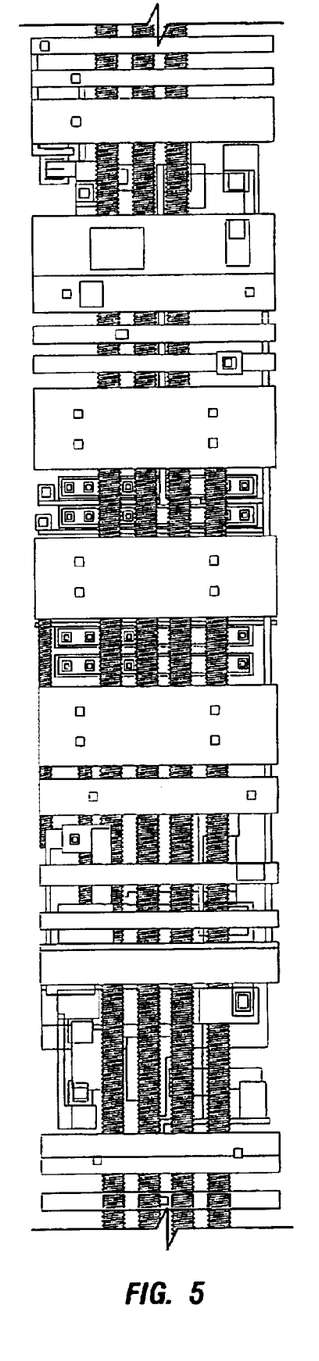
FIG. 5 shows a layout of the circuit.

If a "1" is being held in the calibration latch, the bottom plate of the capacitor is connected to a voltage Vref1 through switch M19. An additional voltage is applied to the signal line. When the capacitor is charged to the signal voltage, switch M23 is maintained as off and the circuit on transistors M20–M22 provides a connection to the bottom plate of the clamp 1. A voltage increment on the signal line can be provided by using two reference voltages: including a reference voltage Vref2, which is double the voltage of Vref1. Therefore, in the case of a "1", the capacitor bottom plate is connected to Vref2 through switch M8 and M12. In contrast, in the case of a "0", the bottom plate is connected to Vref1 through M5 and M18. The results of simulation are shown in FIG. 4, and a layout is shown in FIG. 5. As a whole, this technique may reduce the length of the A/D converter by 10 percent, and decrease the input capacitance by up to 20 percent. A fewer number of total control signals may also be provided.

Figure 6:
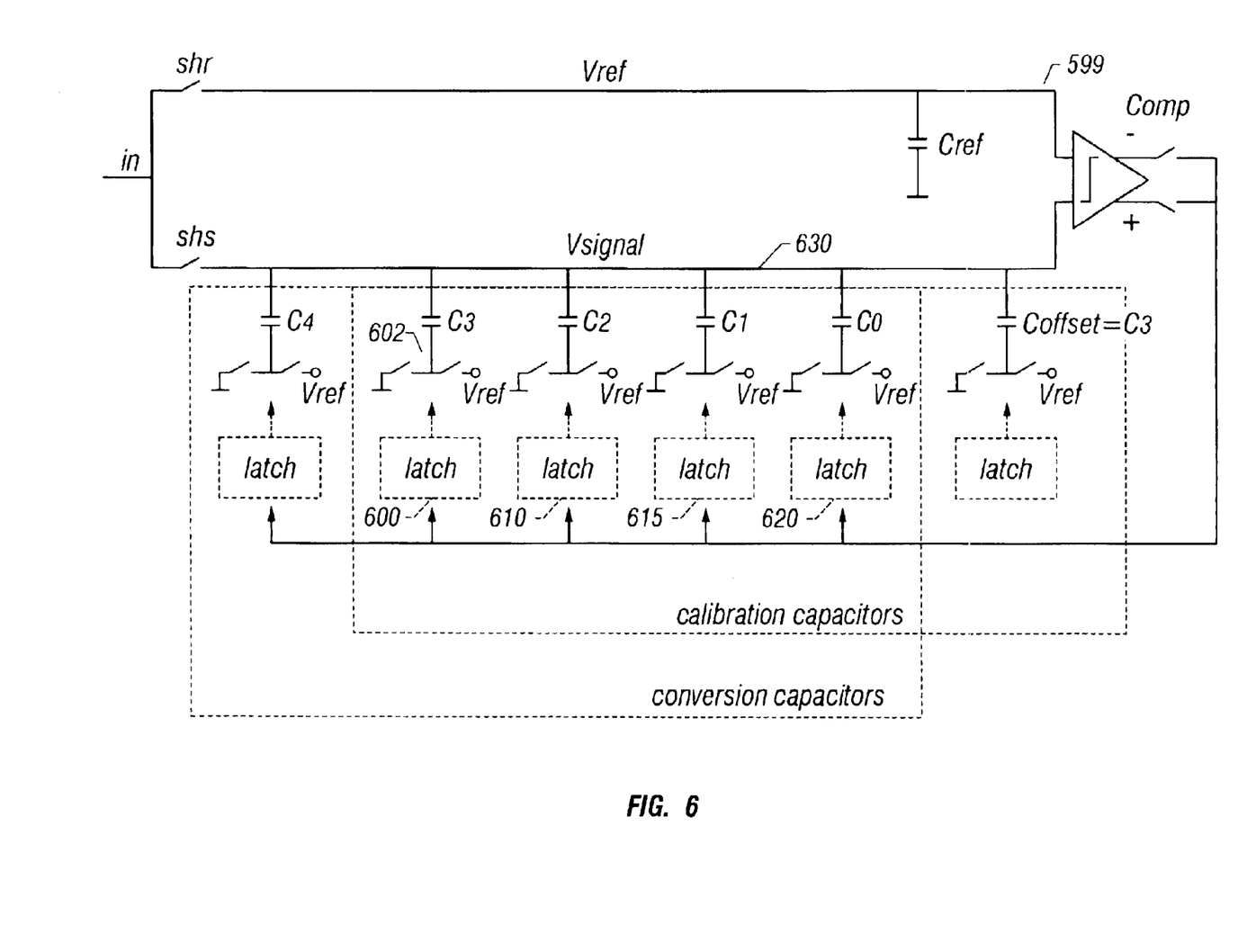
FIG. 6 shows a block diagram of a second embodiment.

Another embodiment is shown in FIG. 6. In this embodiment, an implementation is used which avoids the need for a doubled reference voltage. In this embodiment, each latch such as 600 is associated with a switch 602 which switches between the ground level and a reference level here Vref. The switch may be changed in position by the value in the latch. The associated reference level, that is either the reference level of ground or of the reference, is applied to the bottom plate of the capacitor 602.

One of the concepts of the first embodiment is to perform calibration so that, at the beginning of the conversion, all bottom plates of the capacitors are referenced to ground. The result of calibration is added to the signal so that the signal can be sampled while some capacitor bottom plates are maintained at a reference potential. This operation is followed by switching these nodes to ground.

During calibration in a regular successive approximation A/D converter using calibration capacitors, the result of the calibration is that some of the values are negatively offset (1,0 . . . 0) according to a positive binary code (cn, cn-1, . . . c0). Calibration often uses a negative slope convergence. The operation described above, that is sampling the signal while the bottom plate is at Vref1 followed by connecting that bottom plate to ground, forms a subtraction operation. The following mathematical operation can be carried out:

+CODE=-(-CODE), where code is the correction value.

The first negative of the code operation is done in the calibration latches by changing the derived code into its negative value or two's complement. Then the code is negatived again. As an example, a calibration capacitor is used with the reference voltage for a four bit calibration. The calibration code determined is 1010. Therefore, the negative offset for five-bit calibration is 1000. The calibration code is added to the signal by the following. First, the negative value of 1010, here 0110, is stored in the latches 600, 610, 615, 620. At this time, the signal 630 is sampled into the A/D converter 599. The values are translated into values applied to the capacitors.

Those which have the value of 1 are charged to the voltage reference, here capacitors C1 and C2. The capacitors with the values 0 are left at ground, here capacitors C0 and C3. The offset capacitor Coffset is also kept at ground. This is followed by hold mode. In the hold mode, all bottom plates of all calibration capacitors are connected to ground. The offset is added to the voltage reference and the conversion procedure is started in the regular way.

In summary, then, a sampling signal for calibration is used, and calibration forms negative steps, as conventional in successive approximation, after making the positive offset from the offset capacitor. The negative comparator output is stored for decision-making. The value of the offset capacitor is compared with the calibrations best match. The resulting value is used for calibration.

Figure 7:
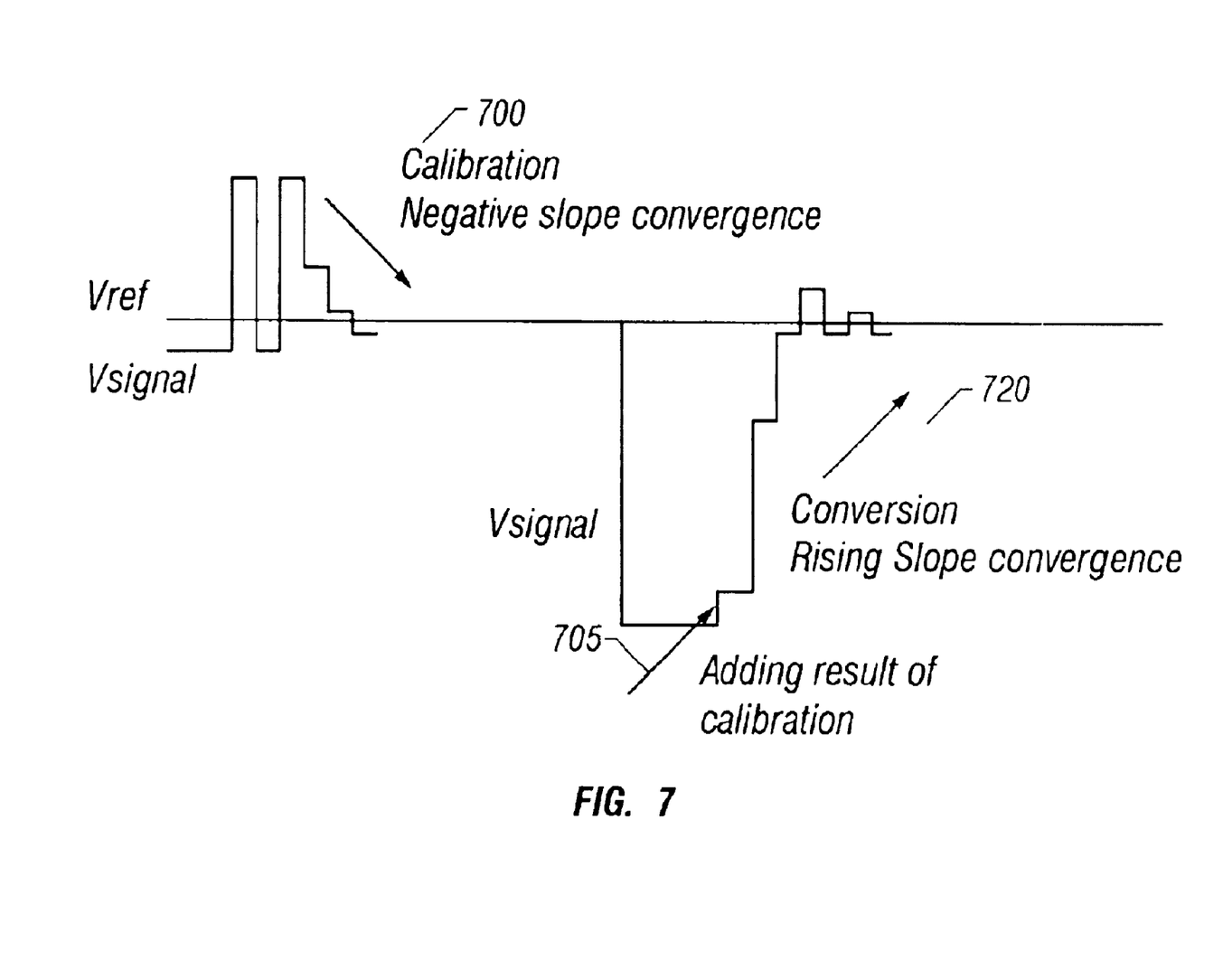
FIG. 7 shows a signal flow diagram of the third embodiment.
Figure 8:
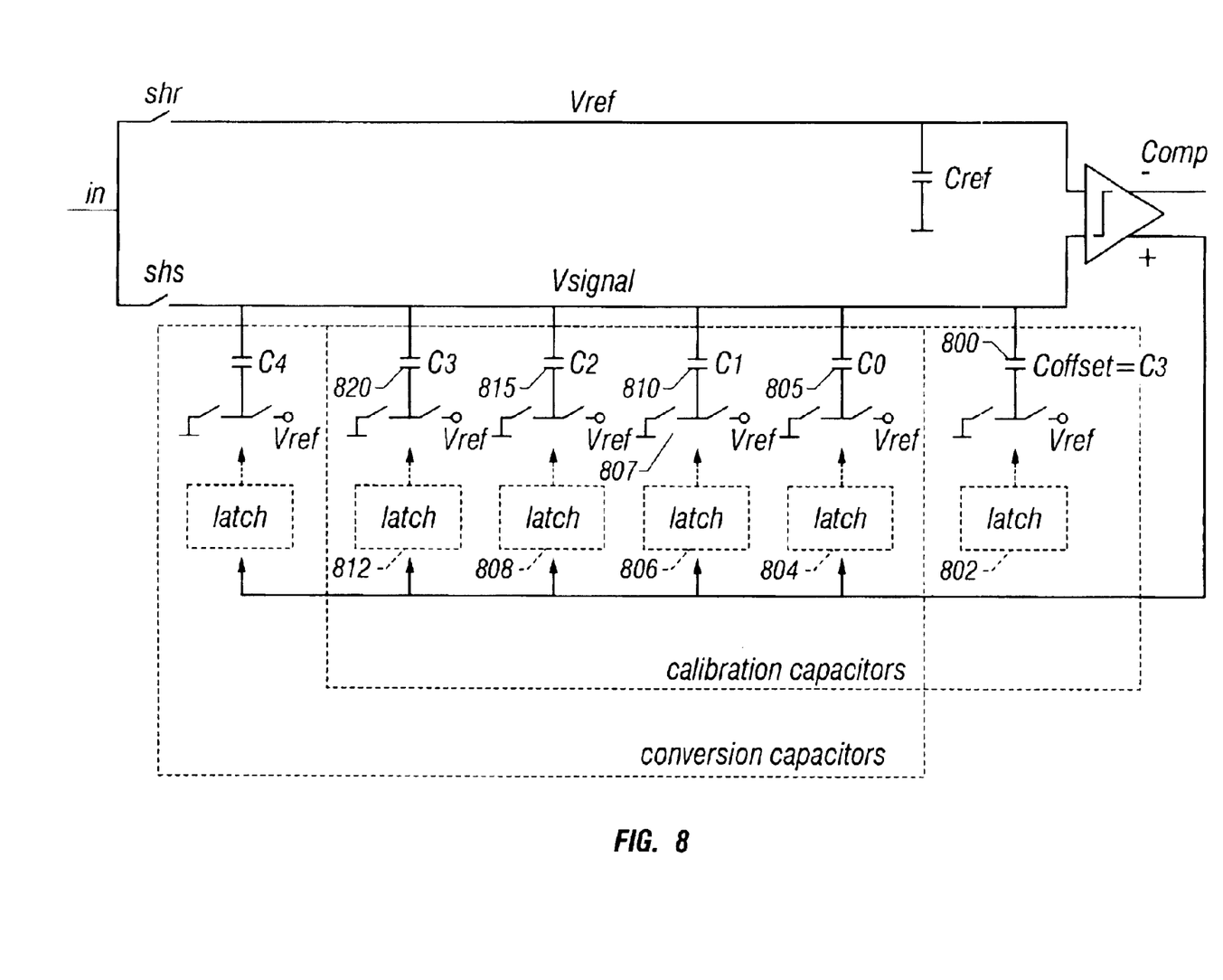
FIG. 8 shows a block diagram of a third embodiment.

The FIG. 7/8 embodiment avoids calculating a negative value in the latch, is as is required in the FIG. 6 embodiment. In FIG. 6, the negative value can be substituted with the two's complement. However, this still may still introduce an error, because the substitution may lose one least significant bit. An improved accuracy system can provide a real adder in the latches, or one extra calibration bit.

The technique in this embodiment uses a negative slope convergence during calibration, followed by a positive slope convergence during conversion. The general process is illustrated in FIG. 7. During a time 700, calibration is carried out, and a negative slope convergence is carried out in which the signal is reduced towards the reference. The signal is then sampled, to provide a negative value. The result of calibration is added at 705, and conversion is carried out at 720 to provide a rising slope convergence.

FIG. 8 shows a block diagram. The sequence of operations is as follows.

First, a calibration signal is sampled while the bottom plates of the calibration capacitors 800, 805, 810, 815, and 820 are biased at the reference voltage Vref. This may allow adding negative compensation signals. An offset voltage is added through the offset capacitor 800 to start the calibration.

During calibration, a negative compensation code is determined. This compensation code is stored in the latches 804, 806, 808, 812. Each latch is associated with a specific calibration capacitor, e.g. latch 806 controls switch 807 which is associated with capacitor 810.

In order to start the calibration, the calibration value must be added to the signal. This is done in two processes. The calibration determines which of the capacitors maintain their bottom plates at ground. For the latches which are maintained at zero, the capacitors have bottom plates at ground. For the latches storing a "1", the capacitor bottom plate receives the reference. This adds the calibration value to the signal.

After sampling the signal using these conditions, the bottom plates are all connected to ground. In this way, the calibration value is added, and conversion can be started with all capacitor bottom plates grounded. Therefore, calibration is carried out in the conventional way, using an offset from the offset capacitor 800. The resulting calibration value is found. In the successive approximation case, negative steps are used to find the best match after getting positive output from the offset capacitor. A calibration value is obtained, and added to the signal.

In this way, conversion can be carried out using positive increments.

Although only a few embodiments have been disclosed in detail above, other modifications are possible. For example, the capacitors which are used for calibration may be precisely the same as those used for conversion or may be partially overlapped with those used for conversion. At least a plurality of the capacitors which are used for conversion should also be used for calibration. All such modifications are intended to be encompassed within the following claims, in which.

What is claimed is:

1. An A/D converter, comprising:
 a plurality of capacitors and at least one comparator, arranged to perform an analog to digital conversion of an analog input signal to a digital output signal;
 a plurality of level latches;
 a control circuit, controlling said plurality of level latches; wherein
  said plurality of capacitors are used for both analog to digital conversion and for calibration,
  said control circuit stores in said plurality of level latches levels associated with calibration, and
  said plurality of level latches are connected to control a level applied to respective bottom plates of said capacitors.

2. The converter as in claim 1, wherein said a top plate of each said capacitor is connected together to form a comnmon line.

3. The converter as in claim 2, wherein said level supplied to a bottom plate of each said capacitors can be one of two different voltage levels or a ground level.

4. The converter as in claim 1, further comprising an image acquisition element, obtaining information indicative of a portion of an image, and producing an output indicative thereof, said an output being analog to digitally converted by said analog to digital converter.

5. The converter as in claim 4, wherein said image acquisition element is a MOS element.

6. The converter as in claim 5, wherein said image acquisition element is one of a MOS photo diode or a MOS photo gate, and forms an active pixel sensor.

7. The converter as in claim 1, wherein said level can be one of ground or a single voltage level.

8. The converter as in claim 1, wherein said level latches store a negative version of a calibration level.

9. The converter as in claim 8, wherein said negative version is stored in said level latches in a two's compliment format.

10. An A/D converter comprising:
 a plurality of capacitors, each associated with a specified bit of the digital signal, and each having a top plate connected to a common line and a bottom plate, and a comparator, connected to receive said common line as an output of said capacitor at one input, and a signal at another input; and
 a plurality of value latches, each storing a value, and each associated with one of said plurality of capacitors, and changing a value applied to said bottom plate of said capacitor;
 wherein the same said capacitors are used both for calibration and for A/D conversion.

11. The converter as in claim 10, wherein said latches store either a one or a zero, and apply either a ground level or a reference level to said capacitor bottom plates depending on the value stored by said latches.

12. The converter as in claim 11, wherein said reference level includes two reference levels, one higher than the other.

13. The converter as in claim 11, wherein said reference level includes a single reference level.

14. The converter as in claim 11, further comprising a switch, controlled by a level in said latch, and selectively providing either a ground level or a reference level to said capacitor.

15. The converter as in claim 10, further comprising a control circuit, controlling said value latches to store a calibration value, and use said calibration value during analog to digital conversion.

16. The converter as in claim 15, further comprising an image sensing element, producing an output signal indicative of a portion of said image, said output signal being coupled to said plurality of capacitors and comparator to be A/D converted thereby.

17. The converter as in claim 16, wherein said image sensing element is an element formed of MOS elements.

18. The converter as in claim 16, wherein said image sensing element is an active pixel sensor, having a photoreceptor, a follower associated with said photoreceptor, and a selector which allows electronic selection, also associated with said photoreceptor.

19. The converter as in claim 18, wherein said image sensing element is one of a photo diode or a photo gate.

20. The converter as in claim 18, wherein said follower and said selector are each formed using CMOS elements.

21. The converter as in claim 20, wherein said value latches are each formed using CMOS elements.

22. The converter as in claim 21, wherein said value latches, said comparator and said capacitors, and a plurality of said image sensing elements, are each formed on a common substrate.

23. The converter as in claim 15, wherein said value latches are formed of CMOS elements.

24. The converter as in claim 15, wherein said value latches store a value calibration value.

25. The converter as in claim 15, wherein said value latches store a negative of a calibration value.

26. A method, comprising:
 calibrating an A/D converter using a plurality of first capacitors, each having a top plate and a bottom plate;
 obtaining a signal to be converted by said A/D converter; and
 converting said signal to a digital signal;
 wherein said converting uses the plurality of said first capacitors by supplying the signal to be converted to the top plates of said first capacitors while setting respective levels of said bottom plates of said first capacitors based on a respective plurality of calibration levels from said calibration.

27. The method as in claim 26, wherein said calibration levels are stored in a memory.

28. The method as in claim 27, wherein said memory includes a plurality of bits associated with said capacitors, each bit storing a value which adjusts a level that is applied to each said capacitor.

29. The method as in claim 26, further comprising storing a calibration level obtained during said calibrating, and using the stored calibration level to apply a calibration level to at least one of said capacitors based on a level of said calibration.

30. The method as in claim 29, wherein levels of said bottom plates include a single reference level and a ground level.

31. The method as in claim 26, further comprising obtaining a signal indicative of a portion of an image, and using said signal for said converting.

32. The method as in claim 31, wherein said obtaining a signal comprises attaining a signal on the-same substrate as said A/D converter.

33. The method as in claim 26, wherein said calibrating further comprising obtaining a complement of a calibration level and storing said complement in a plurality of latch elements.

34. A method, comprising:
 obtaining a value indicative of calibration of an A/D converter using a plurality of capacitors to obtain said value;

storing said value in a latch associated with the A/D converter; and converting an input value using said plurality of capacitors;

wherein said value stored in said latch is a multiple bit value, each bit of said multiple bit value respectively associated with, and for controlling a level of a bottom plate of, an individual one of said plurality of capacitors.

35. The method as in claim 34, wherein said input value is a value indicative of a portion of an image.

36. An active pixel sensor, comprising:

a semiconductor substrate, having a plurality of items formed thereon, said items including:

an image acquisition element, formed using MOS formation technology, and having an MOS follower associated therewith and an MOS selection transistor associated therewith, said image acquisition element producing an output signal indicative thereof; and an A/D converter element, also formed using MOS formation technology, including a plurality of capacitors and a comparator, said plurality of capacitors operating both to calibrate said A/D converter element and to convert signals applied to A/D converter element, the same capacitors being used both for said calibration and for said conversion, and further comprising a latch, having a plurality of digital storage portions, each formed of CMOS, and each storing a value based on said calibration, said values used for getting a level of a bottom plate of said plurality of capacitors.

37. The sensor as in claim 36, wherein said A/D converter is a successive A/D converter.

* * * * *